United States Patent
Noorbakhsh et al.

(10) Patent No.: US 10,636,629 B2
(45) Date of Patent: Apr. 28, 2020

(54) SPLIT SLIT LINER DOOR

(71) Applicant: Applied Materials, Inc., Santa Clara, CA (US)

(72) Inventors: Hamid Noorbakhsh, Oakland, CA (US); Reyn Wakabayashi, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 162 days.

(21) Appl. No.: 15/726,139

(22) Filed: Oct. 5, 2017

(65) Prior Publication Data

US 2019/0108983 A1 Apr. 11, 2019

(51) Int. Cl.
| | |
|---|---|
| C23C 16/54 | (2006.01) |
| H01J 37/32 | (2006.01) |
| E06B 3/50 | (2006.01) |
| E06B 5/00 | (2006.01) |
| E05D 15/56 | (2006.01) |
| H01L 21/67 | (2006.01) |
| E06B 7/23 | (2006.01) |

(52) U.S. Cl.
CPC ........ *H01J 37/32513* (2013.01); *E05D 15/56* (2013.01); *E06B 3/50* (2013.01); *E06B 5/00* (2013.01); *E06B 7/23* (2013.01); *H01J 37/32082* (2013.01); *H01L 21/67126* (2013.01); *E05Y 2201/626* (2013.01); *E05Y 2900/602* (2013.01); *H01L 21/67069* (2013.01)

(58) Field of Classification Search
CPC ........... H01J 37/32513; H01J 2237/184; H01J 37/32715; H01J 37/32733; H01J 37/32082; E06B 3/50; E06B 5/00; E06B 7/23; E05D 15/56; E05Y 2201/626; E05Y 2900/602; C23C 16/54; C23C 16/545; C23C 16/52; C23C 14/568; H01L 21/67184; H01L 21/67201; H01L 21/67745; H01L 21/67196; H01L 21/6776; H01L 21/68771; H01L 21/67155; H01L 21/67126; H01L 21/67069

USPC ..................................... 118/719; 156/345.22
See application file for complete search history.

(56) References Cited

U.S. PATENT DOCUMENTS

| | | |
|---|---|---|
| 6,113,734 A | 9/2000 | Woo et al. |
| 6,347,918 B1 | 2/2002 | Blahnik |

(Continued)

OTHER PUBLICATIONS

International Search Report and Written Opinion from PCT/US2018/052262 dated Jan. 22, 2019.

*Primary Examiner* — Rudy Zervigon
(74) *Attorney, Agent, or Firm* — Patterson + Sheridan LLP

(57) ABSTRACT

Embodiments disclosed herein generally relate to a substrate processing chamber component assembly with a split slit liner door assembly. In one embodiment, the split slit liner door assembly has a first door portion having a top surface, a rear face and a font face, a RF conductive gasket is disposed on the front face of the first door portion, a second door portion having sides, a bottom and a front surface, the bottom coupled to the actuator, and a linkage assembly coupling the first door portion to the second door portion wherein the linkage assembly is configured to translate a vertical motion of the second door portion relative to a first door portion and a horizontal motion spacing the first door portion from the second door portion.

20 Claims, 5 Drawing Sheets

(56) References Cited

U.S. PATENT DOCUMENTS

| | | | |
|---|---|---|---|
| 6,390,448 B1* | 5/2002 | Kroeker | F16K 3/188 |
| | | | 251/167 |
| 7,086,638 B2 | 8/2006 | Kurita et al. | |
| 7,147,719 B2 | 12/2006 | Welch et al. | |
| 7,469,715 B2 | 12/2008 | Lee et al. | |
| 9,741,546 B2 | 8/2017 | Carducci et al. | |
| 2002/0051699 A1 | 5/2002 | Nelson et al. | |
| 2003/0172872 A1* | 9/2003 | Thakur | C23C 16/4412 |
| | | | 118/715 |
| 2004/0083978 A1 | 5/2004 | Welch et al. | |
| 2007/0000608 A1* | 1/2007 | Lee | F16K 3/0227 |
| | | | 156/345.3 |
| 2008/0087214 A1 | 4/2008 | Lee et al. | |
| 2008/0210307 A1 | 9/2008 | Matsumoto et al. | |
| 2009/0108544 A1 | 4/2009 | Sico et al. | |
| 2009/0114153 A1 | 5/2009 | Kurita et al. | |
| 2010/0050534 A1 | 3/2010 | Behdjat et al. | |
| 2010/0167544 A1 | 7/2010 | Broeker | |
| 2011/0114261 A1* | 5/2011 | Matsumoto | H01J 37/32192 |
| | | | 156/345.33 |
| 2016/0319422 A1* | 11/2016 | Kurita | C23C 16/45548 |
| 2017/0309457 A1* | 10/2017 | Furukawahara | H01J 37/32513 |
| 2018/0061619 A1 | 3/2018 | Matsuura et al. | |
| 2018/0374722 A1 | 12/2018 | Isago | |

* cited by examiner

SPLIT SLIT LINER DOOR

BACKGROUND

Field

Embodiments described herein generally relate to a substrate processing chamber component assembly with a slit liner door having a RF return path.

Description of the Related Art

In the semiconductor industry, devices are fabricated by a number of manufacturing processes, such as etching and deposition, producing structures on an ever-decreasing size. Some manufacturing processes may generate particles, which frequently contaminate the substrate that is being processed, contributing to device defects. As device geometries shrink, susceptibility to defects increases and particle contaminant requirements become more stringent. Accordingly, as device geometries shrink, allowable levels of particle contamination have been reduced. Additionally, the production of ever smaller devices without defects relies on good uniformity of the plasma utilized in the plasma processing chamber in which the substrate is processed.

The processing chamber typically has a chamber liner. A substrate passage opening is through the processing chamber and the chamber liner to allow the substrate to enter and exit the processing chamber. The substrate passage opening in the liner includes a closure. The closure is spaced from the liner to limit rubbing that can generate particles which may be introduced into the processing environment as a source of contamination. However, uniformity of the plasma in the processing chamber near the closure is difficult to achieve due to the non-uniformity/asymmetry of the chamber liner created by the substrate passage opening. A RF return path of the plasma passes through the chamber liner. Since the return RF current cannot run through the substrate passage opening, the RF return path is longer on the side of the liner through which the passage opening if formed, thus causing a non-uniformity/skew of the plasma near the substrate passage opening of the chamber liner.

Therefore, there is a need for a chamber liner with an improved RF return path.

SUMMARY

Embodiments disclosed herein generally relate to a substrate processing chamber component assembly with a split slit liner door assembly. In one embodiment, the split slit liner door assembly has a first door portion having a top surface, a rear face and a font face, a RF conductive gasket is disposed on the front face of the first door portion, a second door portion having sides, a bottom and a front surface, the bottom coupled to the actuator, and a linkage assembly coupling the first door portion to the second door portion wherein the linkage assembly is configured to translate a vertical motion of the second door portion relative to a first door portion and a horizontal motion spacing the first door portion from the second door portion.

In another embodiment a semiconductor processing chamber component assembly having a split slit liner door assembly is provided. The semiconductor processing chamber has a chamber body, a lid assembly disposed atop the chamber body, wherein a processing volume is formed within the area bounded by the lid assembly and the chamber body, a electrostatic chuck disposed in the processing volume, a liner surrounding the electrostatic chuck and disposed with the processing volume, an opening formed through the chamber body and the liner, and a split slit liner door assembly. The split slit liner door assembly has a first door portion having a top surface, a rear face and a font face, a RF conductive gasket is disposed on the front face of the first door portion, a second door portion having sides, a bottom and a front surface, the bottom coupled to the actuator, and a linkage assembly coupling the first door portion to the second door portion wherein the linkage assembly is configured to translate a vertical motion of the second door portion relative to a first door portion and a horizontal motion spacing the first door portion from the second door portion.

In yet another embodiment, a method is provided for establishing a RF return path through a liner opening in a plasma processing system. The method begins by moving a split slit liner door assembly with an actuator in a vertical direction through a cavity between a liner and a body of a plasma processing chamber wherein the split slit liner door assembly has a first door portion and a second door portion. The first door portion is moved in a substantially horizontal direction while the second door portion coupled thereto by a linkage assembly operates in a substantially vertical direction and the first door portion is RF coupled to the liner when the first liner door covers the liner opening in the plasma processing system.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

For clarity, identical reference numerals have been used, where applicable, to designate identical elements that are common between figures. Additionally, elements of one embodiment may be advantageously adapted for utilization in other embodiments described herein.

DETAILED DESCRIPTION

Embodiments of the invention are directed to a plasma etch chamber, a plasma enhanced chemical vapor deposition chamber, a physical vapor deposition chamber, a plasma treatment chamber, an ion implantation chamber, or other suitable vacuum processing chamber having a substrate passage opening through a chamber liner surrounding the plasma area. Non-uniformity/skew of processing results (e.g., etch, deposition and the like) from asymmetry of the RF return path due to the substrate passage opening are reduced with a split slit liner door for providing an RF conductive return path the substrate passage opening. The RF conductive path provides a substantial symmetrical RF return path 360 degrees around the chamber liner, including adjacent to the substrate passage opening. The split slit liner door blocks also plasma intrusion into the slit liner door cavity while providing RF return path symmetry.

The split slit liner door uses a two piece spring loaded door. One section of the door contacts the liner preferably around the substrate passage opening to provide for a uniform RF return path through the liner. The split slit liner door is configured to directly replace most conventional liner doors without change to the liner or the processing chamber. The improved RF return path provided by the split slit liner door improves process uniformity and provides a major reduction for process skew on the substrate.

Figure 1:
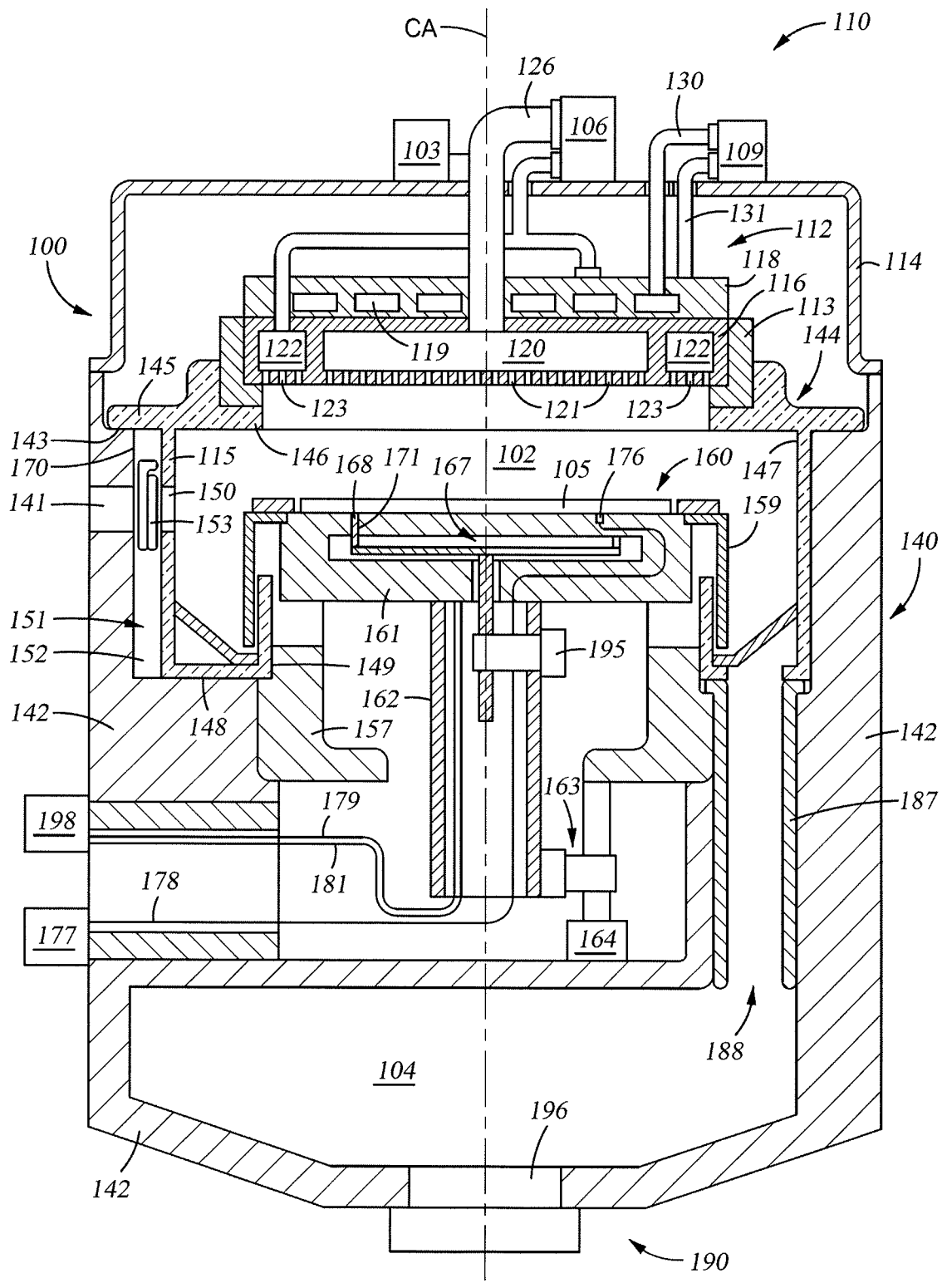
FIG. 1 is a sectional side view illustrating a processing chamber having a split slit liner door, according to one embodiment.

FIG. 1 is a schematic, cross-sectional view of a plasma processing system 100 according to one embodiment of the present invention. The plasma processing system 100 may be a plasma etch chamber, a plasma enhanced chemical vapor deposition chamber, a physical vapor deposition chamber, a plasma treatment chamber, an ion implantation chamber, or other suitable vacuum processing chamber. As shown in FIG. 1, the plasma processing system 100 generally includes a chamber lid assembly 110, a chamber body assembly 140, and an exhaust assembly 190, which collectively enclose a processing region 102 and an evacuation region 104. In practice, processing gases are introduced into the processing region 102 and ignited into a plasma using RF power. A substrate 105 is positioned on a substrate support assembly 160 and exposed to the plasma generated in the processing region 102 to perform a plasma process on the substrate 105, such as etching, chemical vapor deposition, physical vapor deposition, implantation, plasma annealing, plasma treating, abatement, or other plasma processes. Vacuum is maintained in the processing region 102 by the exhaust assembly 190, which removes spent processing gases and byproducts from the plasma process through the evacuation region 104.

The chamber lid assembly 110 generally includes an upper electrode 112 (or anode) isolated from and supported by the chamber body assembly 140 and a chamber lid 114 enclosing the upper electrode 112. The upper electrode 112 is coupled to an RF power source 103 via a conductive gas inlet tube 126. The conductive gas inlet tube 126 is coaxial with a central axis (CA) of the chamber body assembly 140 so that both RF power and processing gases are symmetrically provided. The upper electrode 112 includes a showerhead plate 116 attached to a heat transfer plate 118.

The showerhead plate 116 has a central manifold 120 and one or more outer manifolds 122. The one or more outer manifolds 122 circumscribe the central manifold 120. The central manifold 120 receives processing gases from a gas source 106 through the gas inlet tube 126 and distributes the received processing gases into a central portion of the processing region 102 through a plurality of gas passages 121. The outer manifold(s) 122 receives processing gases, which may be the same or a different mixture of gases received in the central manifold 120, from the gas source 106. The outer manifold(s) 122 then distributes the received processing gases into an outer portion of the processing region 102 through a plurality of gas passages 123.

A heat transfer fluid is delivered from a fluid source 109 to the heat transfer plate 118 through a fluid inlet tube 130. The fluid is circulated through one or more fluid channels 119 disposed in the heat transfer plate 118 and returned to the fluid source 109 via a fluid outlet tube 131.

The chamber body assembly 140 includes a chamber body 142 fabricated from a conductive material resistant to processing environments, such as aluminum or stainless steel. The exhaust assembly 190 is disposed below the chamber body 142 and has evacuation passages 188 positioned symmetrically about the central axis (CA). The evacuation passages 188 allow evacuation of gases from the processing region 102 through the evacuation region 104 and out of the chamber body 142 through an exhaust port 196. Evacuation liner 187 may protect the chamber body 142 from processing gases during evacuation. The evacuation liner 187 may be constructed of materials similar to that of an upper liner assembly 144 as described below.

The substrate support assembly 160 is disposed centrally within a central region 156 of the chamber body assembly 140 wherein the central axis (CA) passes vertically through the center of the substrate support assembly 160. The substrate support assembly 160 generally includes substrate support 161 (or cathode) and a hollow pedestal 162 and is supported by a central support member 157. The substrate support 161 is coupled to the RF power source 103 through a matching network (not shown) and a cable (not shown) routed through the hollow pedestal 162. When RF power is supplied to the upper electrode 112 and the substrate support 161, an electrical field formed therebetween ignites the processing gases present in the processing region 102 into the plasma. In one embodiment, the substrate support 161 is an electrostatic chuck, and thus includes one or more electrodes (not shown) disposed therein. A voltage source (not shown) biases the one or more electrodes with respect to the substrate 105 to create an attraction force to hold the substrate 105 in position during processing.

An actuation assembly 163 is attached to the chamber body 142 and/or the central support member 157. The actuation assembly 163 includes an actuator 164 (e.g., motor), which, in turn raises or lowers the pedestal 162 to provides vertical movement of the substrate support 161 relative to the upper electrode 112. A plasma screen 159 is also provided, supported by the substrate support 161 and overlaps the upper liner assembly 144, to protect the substrate support assembly 160 from the plasma in the processing region 102.

The substrate support assembly 160 further includes a lift pin assembly 167 to facilitate loading and unloading of the substrate 105. The lift pin assembly 167 includes lift pins 168 which extend through lift pin holes 171 disposed in the substrate support 161. The lift pin 168 is coupled to an actuator 195 (e.g., motor) which advances or retracts the lift pins 168.

The substrate support assembly 160 may also include a gas port 176 disposed therethrough and coupled to an inert gas supply 177 via a gas supply line 178. The gas supply 177 supplies an inert gas, such as helium, through the gas supply line 178 and the gas port 176 to the backside of the substrate 105 in order to help prevent processing gases from processing the backside of the substrate 105.

The substrate support assembly 160 may further include one or more fluid inlet lines 179 and fluid outlet lines 181 routed from a heat exchange fluid source 198 to through one or more heat exchange channels (not shown) in the substrate support 161 in order to provide temperature control to the substrate support 161 during processing.

The upper liner assembly 144 is disposed within an upper portion of the chamber body 142 circumscribing the processing region 102. The upper liner assembly 144 may be constructed from a conductive, process compatible material, such as aluminum, stainless steel, and/or yttria (e.g., yttria coated aluminum). In practice, the upper liner assembly 144 shields the upper portion of the chamber body 142 from the plasma in the processing region 102 and is removable to allow periodic cleaning and maintenance.

The chamber body 142 includes a ledge 143 that supports an outer flange 145 of the upper liner assembly 144. An inner flange 146 of the upper liner assembly 144 supports the upper electrode 112. An insulator 113 is positioned between the upper liner assembly 144 and the upper electrode 112 to provide electrical insulation between the chamber body assembly 140 and the upper electrode 112.

The upper liner assembly 144 includes an outer wall 147 attached to the inner and outer flanges (146,145), a bottom wall 148, and an inner wall 149. The outer wall 147 and inner wall 149 are substantially vertical, cylindrical walls. The outer wall 147 is positioned to shield the chamber body 142 from plasma in the processing region 102, and the inner wall 149 is positioned to at least partially shield the side of the substrate support assembly 160 from plasma in the processing region 102. The bottom wall 148 joins the inner and outer walls (149, 147).

The processing region 102 is accessed through a substrate passage opening 141 disposed in the chamber body 142 that allows entry and removal of the substrate 105 into/from the substrate support assembly 160. The upper liner assembly 144 has an opening 150 disposed therethrough that matches the substrate passage opening 141 to allow passage of the substrate 105 therethrough. The chamber body assembly 140 includes a slit valve door assembly 151. The slit valve door assembly 151 is disposed in a cavity 170 defined between the outer wall 147 and the chamber body 142. The slit valve door assembly 151 includes an actuator 152 and a split slit liner door 153. The actuator 152 is coupled to the split slit liner door 153 and is configured to vertically raise and retract the split slit liner door 153 within the cavity 170, between positions blocking and allowing access through the substrate passage opening 141 and opening 150. The split slit liner door 153 is configured to engage a backside 115 of the outer wall 147 for sealing the opening 150.

Figure 2:
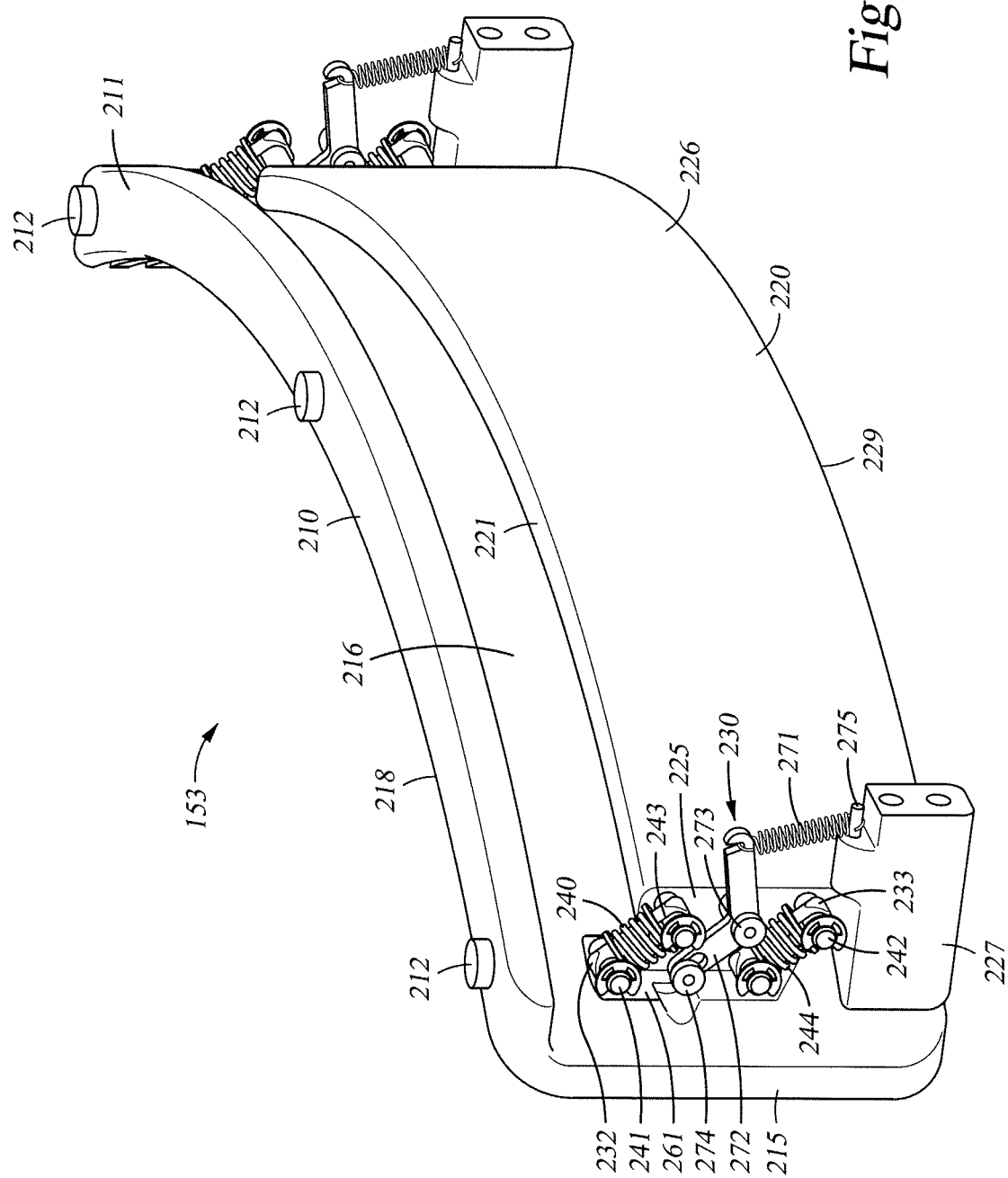
FIG. 2 is an isometric view of the split slit liner door of FIG. 1, according to one embodiment.

The slit valve door assembly 151, and in particular the split slit liner door 153, is further discussed with respect to FIG. 2. FIG. 2 is an isometric view of the split slit liner door 153 of FIG. 1, according to one embodiment. The split slit liner door 153 has a first door portion 210 and a second door portion 220. The first door portion 210 is moveably coupled to the second door portion 220 by a pair of linkage assemblies 230.

The first door portion 210 has a top surface 211, side surfaces 215, a front face 218 and a rear face 216. The first door portion 210 is arc shaped and sized to completely cover the opening 150. The rear face 216 has a mounting surface 261. The mounting surface 261 is configured to accept and interface with the linkage assembly 230. The first door portion 210 may be constructed of a material substantially matching that of the upper liner assembly 144 (e.g., yttria coated aluminum) in order to provide increased electrical symmetry in the upper liner assembly 144. The upper liner assembly 144 provides an RF current ground return path for the RF power used to energize the plasma. Thus, the material of the first door portion 210 enables the split slit liner door 153 to be RF conductive and provide a RF return path across the opening 150 which compensates for changes in the electrical current density and/or distribution that would be present in the upper liner assembly 144 if the RF current was routed around the opening 150.

The first door portion 210 also includes one or more bumpers 212 extending from the top surface 211. The bumpers 212 may be formed from a polymer material, such as rubber or plastic, having good elastic/mechanical and chemical resistance properties that are suitable for high temperatures. In one embodiment, the bumpers are formed from polyether ether ketone (PEEK).

Figure 3:
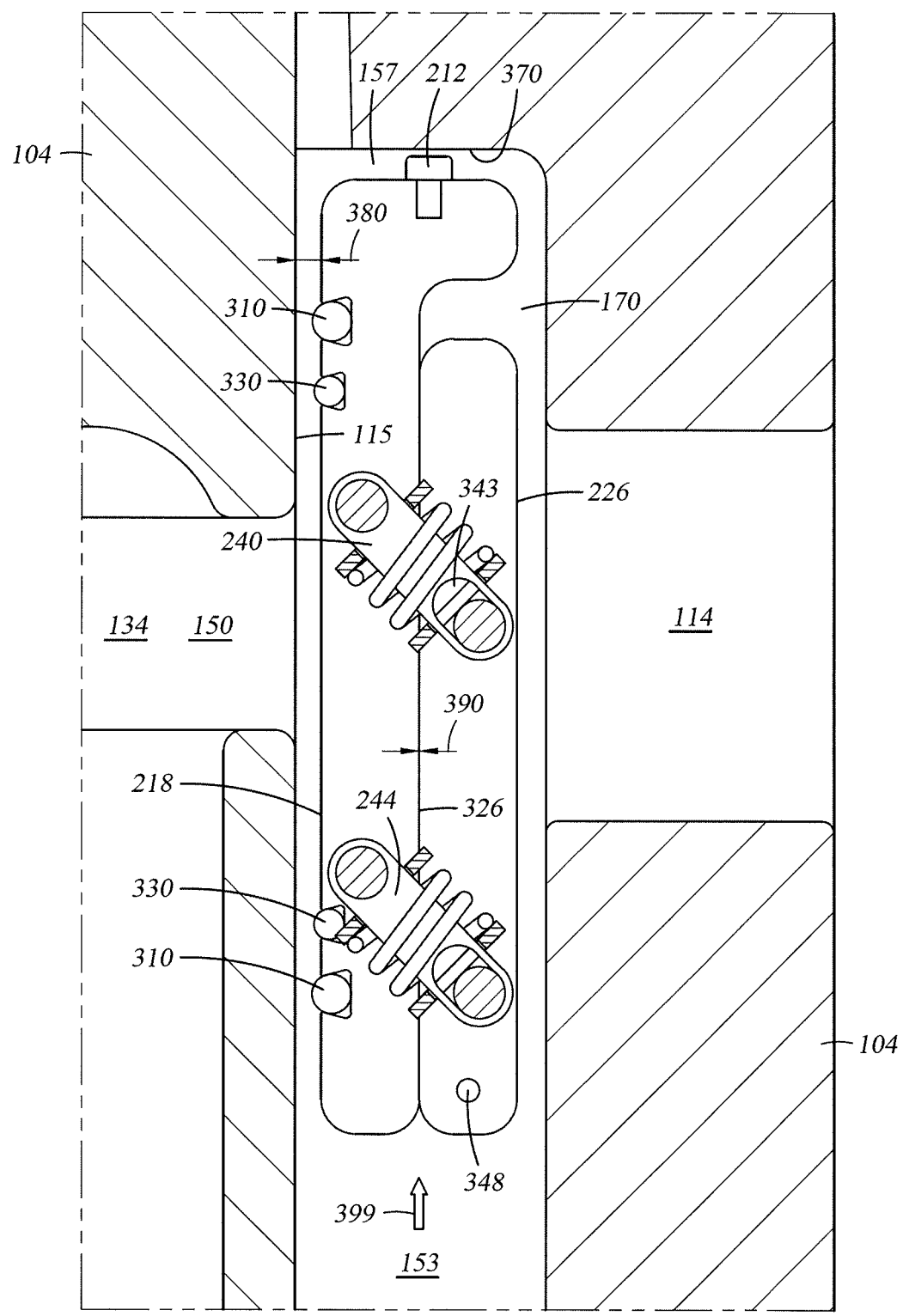
FIG. 3 is an enlarged view of the split slit liner in a closed position prior to activating a cam for sealing the processing chamber, according to one embodiment.

The front face 218 of the first door portion 210 has an RF gasket 310 (visible in FIG. 3). The RF gasket 310 is formed from an RF conductive material. For example, the RF gasket 310 may be formed from silicone, fluorosilicone, fluorocarbon, ethylene propylene diene monomer, graphite/carbon, aluminum, yttria or other suitable material. The RF gasket 310 extends from the front face 218. In one embodiment, the RF gasket 310 may be located in the front face 218 such that when the first door portion 210 covers the opening 150 in the outer wall 147 of the upper liner assembly 144, the RF gasket 310 is located above the opening 150. In another embodiment, the RF gasket 310 may be additionally disposed on the front face 218 to be below the opening 150. In yet other embodiments, the RF gasket may be a conductive O-ring disposed in the front face 218 and completely surrounds the opening 150. The RF gasket 310, in contact with the outer wall 147 and the first door portion 210 when covering the opening 150, makes the first door portion 210 conductively coupled to the outer wall 147 for providing a continuous RF ground with the outer wall 147 of the upper liner assembly 144.

The front face 218 of the first door portion 210 may optionally have a lip seal 330. The lip seal 330 may be disposed on the front face 218 the RF gasket 310 and the portion of the front face 218 exposed to the opening 150 in the outer wall 147. The lip seal 330 may be formed from a material resistant to high temperatures and the processing environment. For example, the lip seal 330 may be formed from polytetrafluoroethylene (PTFE). The lip seal 330 prevents any particles present behind the upper liner assembly 144 from entering the processing chamber through the opening 150 during processing. The lip seal 330 is configured to not impede the RF gasket 310 from making good contact with the outer wall 147 and completing the RF return circuit. Alternately, the lip seal 330 may be made from a RF conductive material.

The second door portion 220 has a top surface 221, a bottom surface 229, a rear surface 226, a front surface 326 (visible in FIG. 3) and side surfaces 225. Extending from each side surface 225 are brackets 227. The brackets 227 and side surfaces 225 interface with the linkage assembly 230. The front surface 326 of the second door portion 220 faces the rear face 216 of the first door portion 210. The second door portion 220 is arc shaped. A length of the arc along the top surface 221 extending from the side surfaces 225 of the second door portion 220 is smaller than a length of the arc along the top surface 211 extending from the side surfaces 215 of the first door portion 210.

The second door portion 220 is coupled to the actuator 152. The actuator 152 operates to move the second door portion 220 in a vertical, up and down, direction. As the first door portion 210 contacts the chamber body near the top of the actuator travel, the upward motion of the second door portion 220 relative to the first door portion 210 functions to actuate the linkage assembly 230. The actuation of the linkage assembly 230 functions to laterally space the first door portion 210 from the second door section 220, urging the second door section against the backside 115 of the outer wall 147.

Each linkage assembly 230 has a first compression spring 232 and a second compression spring 233. The compression springs 232, 233 surround a respective linkage member 240, 244. The linkage members 240, 244 are pivotally attached to a respective support on the first door portion 210 to the second door portion 220. For example, the side surface 225 of the second door portion 220 has a first support 241 upon which the linkage member 240 is attached at a first end. The mounting surface 261 on the rear face 216 of the first door portion 210, has a second support 242 upon which the linkage member 240 is attached at a second end. The linkage member 240 may have an oblong hole 243 through which the second support 242 is disposed. The compression spring 232 biases the second support 242 along the oblong hole 243 to the distal end of the oblong hole 243. Thus, the first door portion 210 is coupled to the second door portion 220 through the linkage member 240.

The linkage assembly 230 may additionally have a tension spring 271 and a tension linkage 272. The tension linkage 272 may be a lever, such as having an "L" or other suitable shape. The tension linkage 272 may be pivotally coupled to a third support 274 at one end and to a fourth support 273 in a middle bend portion. The tension spring 271 is attached to the second end of the tension linkage 272 and to a fifth support on the bracket 227. The tension spring 271 overcomes the force of the compression springs 232, 233 and biases the front surface 326 of the second door portion 220 against the rear face 216 of the first door portion 210 when the second door portion 220 is not in contact with the chamber body when in the raised position. The first door portion 210 and second door portion 220 contacting each other, the thickness of the split slit liner door 153 is collapsed, allowing free movement of the split slit liner door 153 within the cavity without generating wear of the split slit liner door 153 and particles which may contaminate the processing environment. In one embodiment, the split slit liner door 153 has four (4) linkage members and two (2) tension linkages. Each of the linkage members and tension linkages are similarly described.

Figure 5:
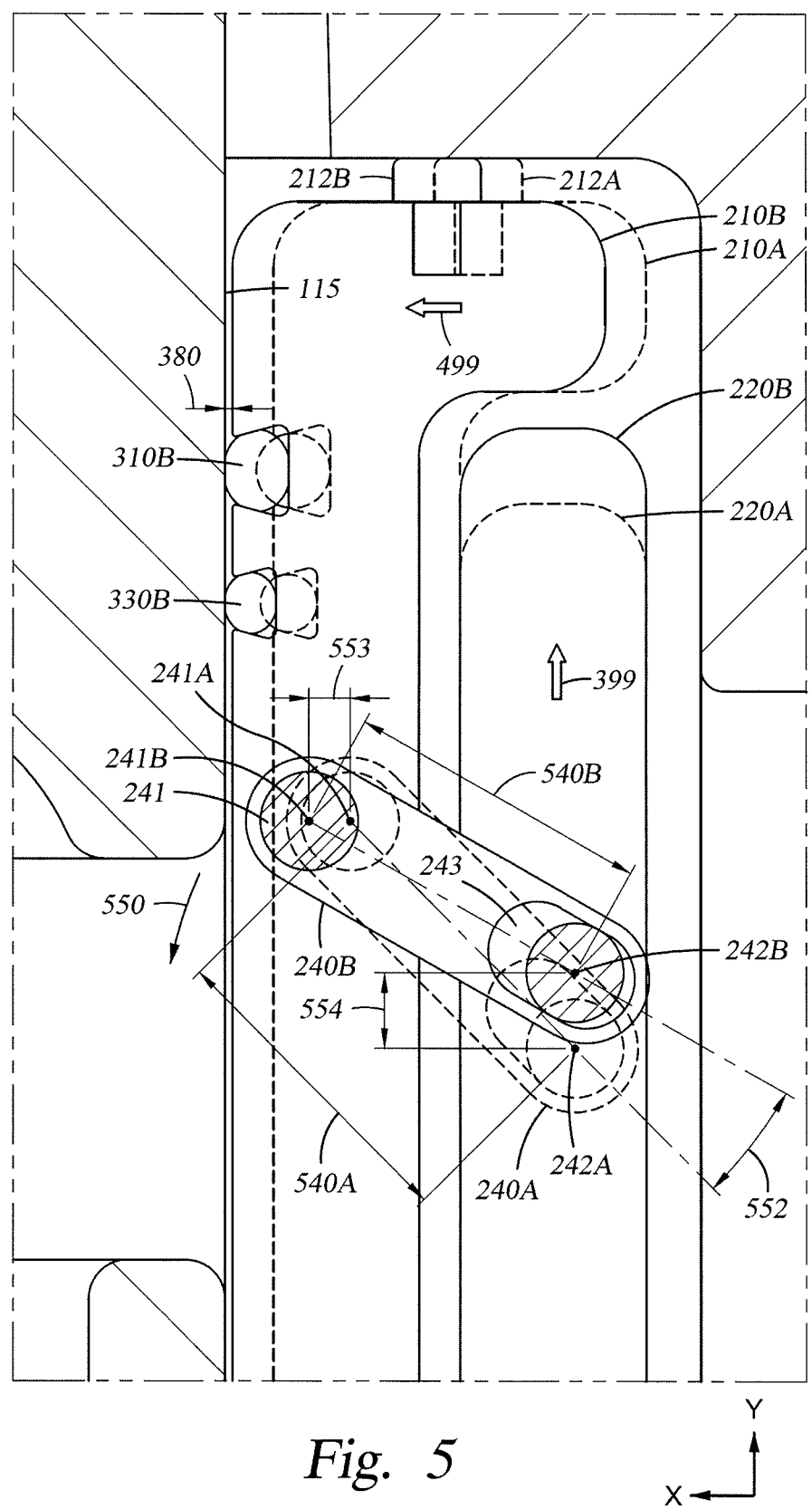
FIG. 5 illustrates the operation for a linkage member.

Turning briefly to FIG. 5, FIG. 5 illustrates the operation for linkage member 240. It should be appreciated that each linkage member in the link assemblies 200 operates in a substantially similar manner. The link assembly 200 is shown operating between a position "A" and a position "B". Position "A" illustrates the split slit liner door 153 with dotted lines and shows having the first door portion 210 and the second door portion 220 both moving vertically at a timeframe where the bumper 212 is just about to come into contact with the top of the cavity 170. Position "B" illustrates the split slit liner door 153 with solid lines and shows having the first door portion 210 moving horizontally while the second door portion 220 moves vertically in a second timeframe where the bumper 212 already is in contact with the top of the cavity 170. Item numbers in FIG. 5 for the split slit liner door 153 are shown with an "A" of "B" suffix to denote whether the item is in position "A" or position "B". Therefore, it should be appreciated that the suffix for the item number merely identifies the position for the item.

The linkage member 240 has a fixed length 540. The second support 242 and the first support 241, being fixed apart by the linkage member 240, are separated by the fixed length 540. The second support 242 being located at the distal end of the oblong hole 243 is vertically lower than the first support 241 such that the linkage member 240 is at a first angle to the horizontal. The first support 241 may move along an arc 550 relative to the second support. As the linkage member 240 rotates in a clockwise direction, increasing to a second angle to the horizontal when taken in a clockwise direction, the first door portion 210 moves from a first position 210A to a second position 210B. The second support 242 moves along the oblong hole 243 toward the first end and compresses the compression spring 232. In this manner, the compression springs 232, 233 set the force upon which the first portion 210 contact the backside 115 of the outer wall 147. Additionally, the compression springs 232, 233 prevent the slit valve door assembly 151 from becoming jammed when closing.

In one embodiment, the first angle is greater than 90 degrees and the second angle is less than 180 degrees. As the first door portion 210 moves in concert with the second door portion 220, the vertical movement along the y-axis for the second door portion 220 may be translated to horizontal movement along the x-axis for the first door portion 210 when the vertical movement of the first door portion 210 is constrained, such as by the bumper 212 coming into contact with a hard stop (e.g., the chamber body or the top of the cavity 170). For example, the last fraction of inches of vertical movement 554 of the second door portion 220 relative to the first door portion 210 operates to space the second door portion 220 horizontally from the first door portion 210, as shown by horizontal movement 553. The significance of this movement will be discussed further below.

Figure 4:
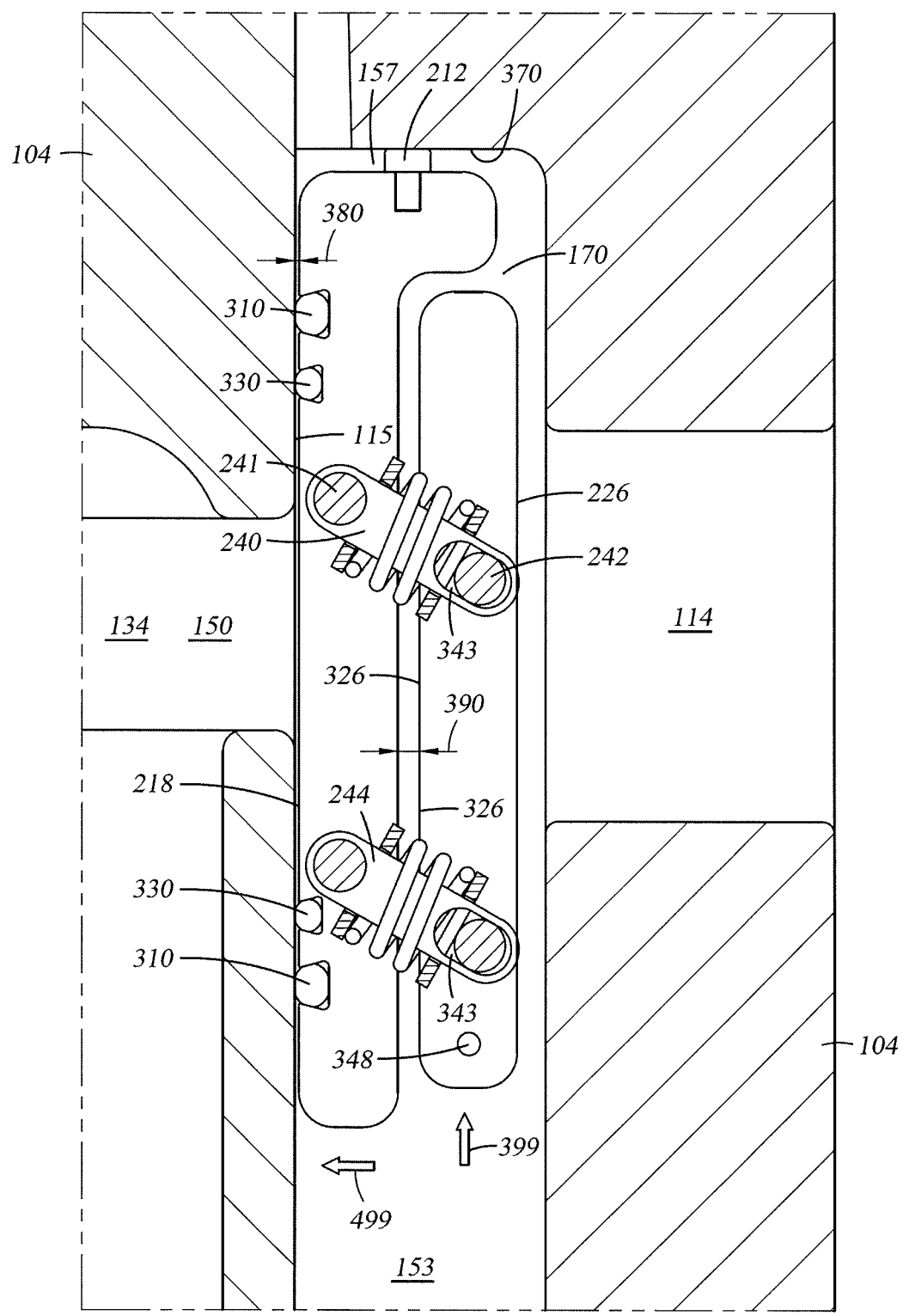
FIG. 4 is an enlarged view the split slit liner in a closed position with the cam activated for sealing the processing chamber, according to one embodiment.

The operation of the slit valve door assembly 151 will be discussed with respect to FIGS. 2 through 5. FIG. 3 is an enlarged view of the split slit liner door in a closed position prior to activating the link assembly 200 for sealing the opening 150, according to one embodiment. FIG. 4 is an enlarged view the split slit liner with the slit valve door assembly 151 in a closed position with the link assembly 200 activated for sealing the opening 150, according to one embodiment.

The slit valve door assembly 151 is moveable upward (Shown by arrow 399) in the cavity 170 by the actuator 152 to position the split slit liner door 153 for sealing the opening 150. A gap 380 is maintained between the first door portion 210 and the backside 115 of the outer wall 147. The oblong hole 243 takes care of the extra displacements due to different sized gaps 380 when the liner (outer wall 147) is heated and expands differently depending the temperature settings, e.g., heating between 90° Celsius and 120° Celsius or even much higher. The first door portion 210 closes and contacts the backside 115 of the outer wall 147 for a 'zero' sized gap 380 and provide RF continuity at different sized gaps 380 which change due to thermal expansion. The second support 242 will move within the oblong hole 243 with the compression spring 232, 233 biasing the first door portion 210 into contact with the liner preventing over drive of the actuator 152 while at these different sized gaps 380.

An attachment 348 fixes the second door portion 220 to the actuator 152 while the first door portion 210 is coupled to the actuator 152 through the second door portion 220. Thus, the first door portion 210 is not directly attached to the actuator 152 but rather by the link assembly 200. The actuator 152 moves the second door portion 220 in a vertical, up and down, direction. As the slit valve door assembly 151 is moving vertically, the rear face 216 of the first door portion 210 may be in contact with the front surface 326 of the second door portion 220 such a space 390 between them is negligible, thus, allowing the slit valve door assembly 151 to move freely within the cavity 170. The vertical movement of the slit valve door assembly 151 eventually places the bumper 212 of the first door portion 210 in contact with a roof 370 of the cavity 170 formed in the chamber body.

The bumper 212 stops the vertical movement of the first door portion 210. As the second door portion 220 continues to move vertically, the linkage assembly 230 uses the continued vertical movement of the second door portion 220 to create a horizontal movement 499 spacing the first door portion 210 relative to the second door portion 220. The horizontal movement 499 of the first door portion 210 causes the space 390 to increase between the first door portion 210 and the second door portion 220. The horizontal movement 499 additionally causes the RF gasket 310 and lip seal 330 disposed on the front face 218 of the first door portion 210 to come into contact with the backside 115 of the outer wall 147. The horizontal movement 499 of the first door portion 210 into contact with the outer wall 147 prevents rubbing or wear of RF gasket 310 and lip seal 330 against the outer wall 147 and therefore reduces the formation of particles or contamination from the seals which may cause defects on a substrate 105.

The first door portion 210 is RF conductively coupled to the outer wall 147 of the upper liner assembly 144. A force of the coupling can be set with the compression spring 232, 233 to ensure good continuity without hard slamming the split valve door assembly 151 and causing the assembly to get stuck. Thus, the RF current driving the plasma has an uninterrupted uniform ground path through the first door portion 210 and the outer wall 147 thus traversing the opening 150 for ensuring uniformity of the plasma formed in the plasma processing system 100. The first door portion 210 additionally reduces the gap 380 while the compression spring allows for thermal expansion at various temperature settings to prevent light up and arcing between chamber components. Advantageously, the slit valve door assembly 151 improves the etch rate skew by over 50% as compared to conventional designs not having the split slit liner door 153. Additionally, the film contour was reduced by about 30% to produce a more uniform film layer on the substrate. Thus, a more uniform substrate processing result can be obtained for forming more precise geometries for smaller features on the substrate 105.

While the foregoing is directed to specific embodiments, other and further embodiments may be devised without departing from the basic scope thereof, and the scope thereof is determined by the claims that follow.

What is claimed is:

1. A split slit liner door assembly, comprising:
   a first door portion having a top surface, a rear face and a front face;
   a RF conductive gasket disposed on the front face of the first door portion;
   a second door portion;
   a linkage assembly connecting coupling the first door portion to the second door portion, wherein the linkage assembly is configured to translate a vertical motion of the second door portion relative to the first door portion into a horizontal motion of the first door portion relative to the second door portion spacing the first door portion from the second door portion; and
   an actuator configured to provide vertical movement of the second door portion, the actuator connected to the second door portion.

2. The split slit liner door assembly of claim 1 further comprising:
   a bumper disposed on the top surface.

3. The split slit liner door assembly of claim 1 wherein the linkage assembly further comprises:
   a tension spring linkage biasing the first door portion to the second door portion.

4. The split slit liner door assembly of claim 3 wherein the linkage assembly further comprises:
   an oblong hole formed in one end of a linkage of the linkage assembly connecting the first door portion to the second door portion; and
   a compression bias spring disposed over the linkage biasing the first door portion away from the second door portion.

5. The split slit liner door assembly of claim 4 wherein the linkage is connected at a first end to the first door portion and at a second end to the second door portion, and wherein the first end travels in an arc when the horizontal motion spaces the first door portion from the second door portion.

6. The split slit liner door assembly of claim 1 wherein the RF conductive gasket is formed from yttria.

7. The split slit liner door assembly of claim 6 further comprising:
   a seal formed from PTFE.

8. A semiconductor processing chamber comprising:
   a chamber body;
   a lid assembly disposed atop the chamber body, wherein a processing volume is formed within an area bounded by the lid assembly and the chamber body;
   a electrostatic chuck disposed in the processing volume;
   a liner surrounding the electrostatic chuck and disposed with the processing volume;
   an opening formed through the chamber body and the liner; and
   a split slit liner door assembly, comprising:
      a first door portion having a top surface, a rear face and a front face;
      a RF conductive gasket is disposed on the front face of the first door portion;
      a second door portion;
      a linkage assembly connecting the first door portion to the second door portion, wherein the linkage assembly is configured to translate a vertical motion of the second door portion relative to the first door portion into a horizontal motion of the first door portion relative to the second door portion spacing the first door portion from the second door portion; and
      an actuator configured to provide vertical movement of the second door portion, the actuator connected to the second door portion.

9. The semiconductor processing chamber of claim 8 further comprising:
   a bumper is disposed on the top surface.

10. The semiconductor processing chamber of claim 8 wherein the linkage assembly further comprises:
    a tension spring linkage biasing the first door portion to the second door portion.

11. The semiconductor processing chamber of claim 10 wherein the linkage assembly further comprises:
    an oblong hole formed in one end of a linkage of the linkage assembly connecting the first door portion to the second door portion; and
    a compression bias spring disposed over the linkage biasing the first door portion away from the second door portion and against the liner.

12. The semiconductor processing chamber of claim 11 wherein the linkage is connected at a first end to the first door portion and at a second end to the second door portion, and wherein the first end travels in an arc when the horizontal motion spaces the first door portion from the second door portion.

13. The semiconductor processing chamber of claim 8 wherein the RF conductive gasket is formed from yttria.

14. The semiconductor processing chamber of claim 13 further comprising:
   a seal formed from PTFE.

15. An apparatus comprising:
   split slit liner door assembly
      a first door portion having a top surface, a rear face, and a front face;
      a RF conductive gasket disposed on the front face of the first door portion;
      a second door portion having opposing lateral sides;
      a linkage assembly comprising a first linkage sub-assembly and a second linkage sub-assembly, the first linkage sub-assembly and the second linkage sub-assembly being connected to the second door portion on respective ones of the opposing lateral sides, the first linkage sub-assembly and the second linkage sub-assembly further being connected to the first door portion, wherein the linkage assembly is configured to translate a vertical motion of the second door portion relative to the first door portion into a horizontal motion of the first door portion relative to the second door portion spacing the first door portion from the second door portion; and
      an actuator configured to provide vertical movement of the second door portion, the actuator connected to the second door portion.

16. The apparatus of claim 15, wherein each of the first linkage sub-assembly and the second linkage sub-assembly includes:
   a first linkage having a first opening and a second opening, a first support of the first door portion being inserted through the first opening, a second support of the second door portion being inserted through the second opening, the second opening being oblong-shaped;
   a first compression spring disposed on the first linkage between the first opening and the second opening, the first compression spring biasing the first support away from the second support;
   a second linkage having a third opening and a fourth opening, a third support of the first door portion being inserted through the third opening, a fourth support of the second door portion being inserted through the fourth opening, the fourth opening being oblong-shaped;
   a second compression spring disposed on the second linkage between the third opening and the fourth opening, the second compression spring biasing the third support away from the fourth support; and
   a tension linkage connected to the first door portion and the second door portion; and
   a tension spring connected to the tension linkage and configured with the tension linkage to bias the first door portion towards the second door portion.

17. The apparatus of claim 15 further comprising a bumper disposed on the top surface of the first door portion.

18. The apparatus of claim 15, wherein each of the first linkage sub-assembly and the second linkage sub-assembly is configured to travel in an arc when the horizontal motion spaces the first door portion from the second door portion.

19. The apparatus of claim 15, wherein the RF conductive gasket is formed from yttria.

20. The apparatus of claim 15 further comprising a seal disposed on the front face of the first door portion, the RF conductive gasket being disposed around the seal on the front face of the first door portion, the seal being formed from PTFE.

* * * * *

UNITED STATES PATENT AND TRADEMARK OFFICE
CERTIFICATE OF CORRECTION

PATENT NO.         : 10,636,629 B2
APPLICATION NO.    : 15/726139
DATED              : April 28, 2020
INVENTOR(S)        : Hamid Noorbakhsh et al.

It is certified that error appears in the above-identified patent and that said Letters Patent is hereby corrected as shown below:

In the Claims

Column 9, Line 55, in Claim 1, after "connecting" delete "coupling".

Signed and Sealed this
Eighteenth Day of August, 2020

Andrei Iancu
*Director of the United States Patent and Trademark Office*